(12) United States Patent
Suzuki

(10) Patent No.: US 10,658,417 B2
(45) Date of Patent: May 19, 2020

(54) SOLID-STATE IMAGE SENSING DEVICE AND IMAGING APPARATUS

(71) Applicant: Ricoh Company, Ltd., Tokyo (JP)

(72) Inventor: Atsushi Suzuki, Kumamoto (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 16/273,201

(22) Filed: Feb. 12, 2019

(65) Prior Publication Data

US 2019/0288025 A1  Sep. 19, 2019

(30) Foreign Application Priority Data

Mar. 19, 2018 (JP) ................................ 2018-050483

(51) Int. Cl.
| | |
|---|---|
| H01L 27/146 | (2006.01) |
| H04N 5/3745 | (2011.01) |
| H04N 5/378 | (2011.01) |
| H04N 5/355 | (2011.01) |

(52) U.S. Cl.
CPC .. *H01L 27/14643* (2013.01); *H01L 27/14605* (2013.01); *H01L 27/14612* (2013.01); *H04N 5/3559* (2013.01); *H04N 5/378* (2013.01); *H04N 5/37455* (2013.01); *H04N 5/37457* (2013.01)

(58) Field of Classification Search
CPC ......... H01L 27/14643; H01L 27/14605; H01L 27/14612; H04N 5/378; H04N 5/37457; H04N 5/3559; H04N 5/37455; H04N 5/376
See application file for complete search history.

(56) References Cited

U.S. PATENT DOCUMENTS

| | | | | |
|---|---|---|---|---|
| 2010/0259662 | A1* | 10/2010 | Oike ...................... | H04N 5/335 348/308 |
| 2015/0029375 | A1* | 1/2015 | Sugawa ............... | H04N 5/3575 348/308 |
| 2016/0141326 | A1* | 5/2016 | Hanzawa .......... | H01L 27/14603 250/208.1 |
| 2016/0249004 | A1* | 8/2016 | Saeki ...................... | H03L 7/08 |
| 2017/0244919 | A1 | 8/2017 | Suzuki | |
| 2017/0256575 | A1 | 9/2017 | Suzuki | |
| 2018/0255253 | A1 | 9/2018 | Suzuki | |
| 2019/0082133 | A1* | 3/2019 | Shikina .................. | H04N 5/378 |

FOREIGN PATENT DOCUMENTS

| | | |
|---|---|---|
| JP | 2010-245955 | 10/2010 |
| JP | 2017-152481 | 8/2017 |

* cited by examiner

*Primary Examiner* — Mekonnen D Dagnew
(74) *Attorney, Agent, or Firm* — Xsensus LLP

(57) ABSTRACT

A solid-state image sensing device includes a pixel array, control lines, signal lines, a pixel control circuit, and a read circuit. The pixel array includes pixel sub-arrays arranged in a main scanning direction and each including pixels arranged to form rows along the main scanning direction and at least one column along a sub-scanning direction. Each of the control lines is connected to at least one pixel in in one of the pixel sub-arrays. Pixels in each of the least one column is connected to different control lines. Each of the signal lines is connected to all pixels in each of the least one column in one of the pixel sub-arrays. The pixel control circuit generates a pixel signal in each pixel and the read circuit reads the pixel signal from each pixel to cause successive phase differences between the pixel sub-arrays.

8 Claims, 8 Drawing Sheets

SOLID-STATE IMAGE SENSING DEVICE AND IMAGING APPARATUS

CROSS-REFERENCE TO RELATED APPLICATION

This patent application is based on and claims priority pursuant to 35 U.S.C. § 119(a) to Japanese Patent Application No. 2018-050483 filed on Mar. 19, 2018, in the Japan Patent Office, the entire disclosure of which is hereby incorporated by reference herein.

BACKGROUND

Technical Field

The present invention relates to a solid-state image sensing device and an imaging apparatus.

Description of the Related Art

A solid-state image sensing device, such as a complementary metal oxide semiconductor (CMOS) image sensor, includes a pixel array and a read circuit arranged at the periphery of the pixel array. The pixel array includes a plurality of pixels arranged in an array in a main scanning direction and a sub-scanning direction. The read circuit reads pixel signals from the pixels of the pixel array via signal lines. Each of the pixels of the pixel array includes a photoelectric conversion element such as a photodiode, a floating diffusion region for converting an electric charge generated by photoelectric conversion into a voltage, a charge transfer transistor, a reset transistor, and an amplifier transistor. The read circuit includes an analog amplifier and an analog-to-digital converter, for example. Normally, the read circuit simultaneously reads pixel signals of a plurality of pixels arranged in the main scanning direction, and thus includes a plurality of circuit parts corresponding to the pixels.

The CMOS image sensor may be manufactured by a typical CMOS process, and may include an analog circuit and a digital circuit within the same integrated circuit. The CMOS image sensor is therefore advantageous in that the pixel array and peripheral circuits thereof (e.g., the read circuit) are configurable as an integrated circuit, thereby reducing the number of components.

In a CMOS line sensor, as an example of the CMOS image sensor, a large number of pixels are arranged in the main scanning direction, while a small number of pixels are arranged in the sub-scanning direction. Therefore, the area of the pixel array of the CMOS line sensor is substantially smaller than that of an area sensor, and the peripheral circuits of the pixel array occupy most of the area of the integrated circuit of the CMOS line sensor.

In the existing CMOS line sensor, however, the read circuit simultaneously reads the pixel signals of the plurality of pixels arranged in the main scanning direction, and thus includes the plurality of circuit parts corresponding to the pixels, as described above. This configuration increases the circuit size of an integrated circuit including the CMOS line sensor, thereby increasing cost.

SUMMARY

In one embodiment of this invention, there is provided an improved solid-state image sensing device that includes, for example, a pixel array, a plurality of control lines, a plurality of signal lines, a pixel control circuit, and a read circuit. The pixel array includes a plurality of pixels arranged two-dimensionally in a main scanning direction and a sub-scanning direction to generate a pixel signal in each of the plurality of pixels in accordance with incident light. The pixel array includes a plurality of pixel sub-arrays arranged in the main scanning direction. Each of the plurality of pixel sub-arrays includes a plurality of pixels arranged to form a plurality of rows along the main scanning direction and at least one column along the sub-scanning direction. The plurality of control lines are connected to the plurality of pixels in the plurality of pixel sub-arrays. Each of the plurality of control lines is connected to at least one of the plurality of pixels in one of the plurality of pixel sub-arrays. A plurality of pixels in each of the at least one column in each of the plurality of pixel sub-arrays are connected to different ones of the plurality of control lines. The plurality of signal lines are connected to the plurality of pixels in the plurality of pixel sub-arrays. Each of the plurality of signal lines is connected to all pixels in each of the at least one column in one of the plurality of pixel sub-arrays. The pixel control circuit applies a control signal to each of the plurality of pixels in the plurality of pixel sub-arrays via the plurality of control lines to generate the pixel signal in each of the plurality of pixels in the plurality of pixel sub-arrays to cause successive phase differences between the plurality of pixel sub-arrays. The read circuit reads the pixel signal from each of the plurality of pixels in the plurality of pixel sub-arrays via the plurality of signal lines to cause successive phase differences between the plurality of pixel sub-arrays.

In one embodiment of this invention, there is provided an improved imaging apparatus that includes, for example, the above-described solid-state image sensing device, an optical system that guides the incident light to each of the plurality of pixels in the solid-state image sensing device, a signal processing circuit that processes an output signal from the solid-state image sensing device, and a drive device that drives the solid-state image sensing device.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein.

Figure 1:
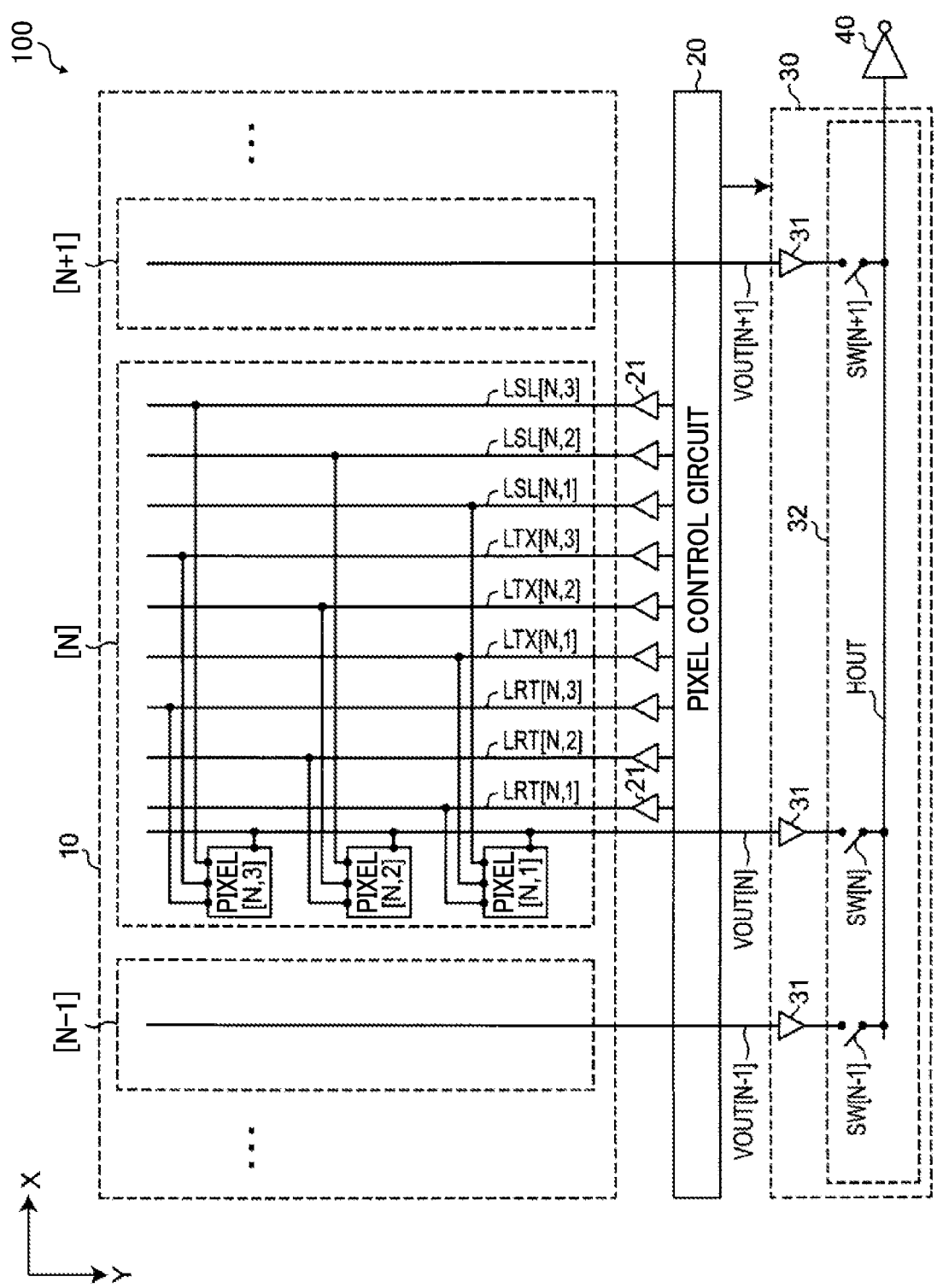
FIG. 1 is a block diagram illustrating a general arrangement of a solid-state image sensing device according to a first embodiment of the present invention.

The accompanying drawings are intended to depict embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Embodiments of the present invention will be described in detail with reference to the drawings below.

A first embodiment of the present invention will be described.

FIG. 1 is a block diagram illustrating a general arrangement of a solid-state image sensing device 100 according to the first embodiment of the present invention. The solid-state image sensing device 100 in FIG. 1 includes a pixel array 10, a pixel control circuit 20, a read circuit 30, an amplifier 40, a plurality of control lines LRT [a, b], LTX [a, b], and LSL [a, b], and a plurality of signal lines VOUT [a]. These component elements of the solid-state image sensing device 100 are formed on a semiconductor substrate, for example.

The pixel array 10 includes a plurality of pixels [a, b], each of which generates a pixel signal in accordance with incident light. The pixels [a, b] are arranged two-dimensionally in the main scanning direction (i.e., the X direction in FIG. 1) and the sub-scanning direction (i.e., the Y direction in FIG. 1). The pixel array 10 includes a plurality of pixel sub-arrays [a] arranged in the main scanning direction. Each of the pixel sub-arrays [a] includes a plurality of pixels [a, b] arranged to form a plurality of rows (i.e., three rows in FIG. 1) along the main scanning direction and at least one column (i.e., one column in FIG. 1) along the sub-scanning direction. Herein, "a" represents the number of each pixel sub-array (i.e., N−1, N, or N+1 in FIG. 1), and "b" represents the number of each row (i.e., 1, 2, or 3 in FIG. 1).

The pixels [a, b] each have a square shape, and are the same in size, for example. In each of the pixel sub-arrays [a], the pixels [a, b] are arranged at equal intervals in the main scanning direction, for example, and are also arranged at equal intervals in the sub-scanning direction, for example.

Different color components (e.g., blue, green, and red) of light from a subject may be incident on different rows of pixels [a, b] via filters, for example.

The plurality of control lines LRT [a, b], LTX [a, b], and LSL [a, b] are connected to the pixels [a, b] of the pixel sub-arrays [a]. The control lines LRT [a, b], LTX [a, b], and LSL [a, b] are linear conductors. Herein, each of the control lines LRT [a, b] is connected to at least one pixel [a, b] in one of the pixel sub-arrays [a]. Similarly, each of the control lines LTX [a, b] is connected to at least one pixel [a, b] in one of the pixel sub-arrays [a], and each of the control lines LSL [a, b] is connected to at least one pixel [a, b] in one of the pixel sub-arrays [a]. Further, all pixels [a, b] in each column in each of the pixel sub-arrays [a] are connected to different control lines LRT [a, b], different control lines LTX [a, b], and different control lines LSL [a, b]. In the example of FIG. 1, a pixel [N, 1] is connected to control lines LRT [N, 1], LTX [N, 1], and LSL [N, 1]. Similarly, a pixel [N, 2] is connected to control lines LRT [N, 2], LTX [N, 2], and LSL [N, 2], and a pixel [N, 3] is connected to control lines LRT [N, 3], LTX [N, 3], and LSL [N, 3].

The plurality of signal lines VOUT [a] are connected to the pixels [a, b] in the pixel sub-arrays [a]. The signal lines VOUT [a] are linear conductors. Herein, all pixels [a, b] in each column in each of the pixel sub-arrays [a] are connected to one signal line VOUT [a].

Although only the pixel sub-array [N] is illustrated in detail in FIG. 1 and other drawings, the other pixel sub-arrays [a] (e.g., the pixel sub-arrays [N−1] and [N+1]) are configured similarly to the pixel sub-array [N].

The pixel control circuit 20 is formed facing the pixel sub-arrays [a]. The pixel control circuit 20 applies control signals to the pixels [a, b] of the pixel sub-arrays [a] via the control lines LRT [a, b], LTX [a, b], and LSL [a, b]. Thereby, the pixel control circuit 20 generates analog pixel signals in the pixels [a, b] of the pixel sub-arrays [a] such that the pixel sub-arrays [a] have successive phase differences. Herein, "successive" means that, when the pixel signals are read from the pixels [a, b] of the pixel sub-arrays [a] with reference to the leftmost pixel [a, b] of the pixel array 10, for example, the phase difference increases in the main scanning direction in which the pixel sub-arrays [a] are arranged. Further, the pixel control circuit 20 sequentially generates the pixel signals for each of the rows of the entire pixel array 10. The control lines LRT [a, b], LTX [a, b], and LSL [a, b] are equipped with amplifiers 21 between the pixel control circuit 20 and the pixel sub-arrays [a].

The read circuit 30 is formed facing the pixel sub-arrays [a], and includes a plurality of amplifiers 31 and a transfer circuit 32. The plurality of amplifiers 31 are located on the signal lines VOUT [a] between the pixel sub-arrays [a] and the transfer circuit 32, and amplify, in an analog manner, the pixel signals read from the pixels [a, b]. The transfer circuit 32 includes a signal line HOUT and a plurality of switches SW [a], which are the same in number as the signal lines VOUT [a]. Each of the switches SW [a] selectively transmits the pixel signals amplified by the corresponding amplifier 31 to the signal line HOUT. The signal line HOUT transmits the pixel signals read from the pixels [a, b] to the amplifier 40 in an analog manner as serial signals. Thereby, the read circuit 30 reads the pixel signals from the pixels [a, b] of the pixel sub-arrays [a] via the signal lines VOUT [a] such that the pixel sub-arrays [a] have the successive phase differences. Further, for each of the rows of the entire pixel array 10, the read circuit 30 sequentially reads the pixel signals sequentially generated for each of the rows of the entire pixel array 10 by the pixel control circuit 20.

The pixel control circuit 20 and the read circuit 30 operate in synchronization with each other. For example, the read circuit 30 may operate under the control of the pixel control circuit 20.

The amplifier 40 amplifies the signals output from the read circuit 30. As a circuit subsequent to the amplifier 40, an analog signal processing circuit may additionally be provided as an interface between the solid-state image sensing device 100 and an external device. Alternatively, an analog-to-digital converter circuit and a digital signal processing circuit may be provided.

In the example of FIG. 1, the pixel array 10, the pixel control circuit 20, and the read circuit 30 are arranged in the sub-scanning direction. Further, in the example of FIG. 1, each of the control lines LRT [a, b], LTX [a, b], and LSL [a, b] and the signal lines VOUT [a] includes a conductive segment arranged along the sub-scanning direction. Further, as described above, the pixel control circuit 20 and the read circuit 30 are formed facing the pixel sub-arrays [a] of the pixel array 10. This arrangement enables the pixel control circuit 20 and the read circuit 30 not to simultaneously control all pixels [a, b] in each of the rows of the entire pixel array 10 but to control the pixels [a, b] for each of the pixel sub-arrays [a].

The respective segments of the control lines LRT [a, b], LTX [a, b], and LSL [a, b] arranged along the sub-scanning direction may have the same length, i.e., a length equal to the distance between the pixel control circuit 20 and the pixel [N, 3] farthest from the pixel control circuit 20 among the pixels [N, 1], [N, 2], and [N, 3]. In this case, the control lines LRT [a, b], LTX [a, b], and LSL [a, b] are evenly arranged over the entire pixel array 10 in the sub-scanning direction. Therefore, vignetting of light due to the control lines LRT [a, b], LTX [a, b], and LSL [a, b] becomes uniform over the entire pixel array 10 in the sub-scanning direction, thereby attaining a uniform sensitivity characteristic.

Figure 2:
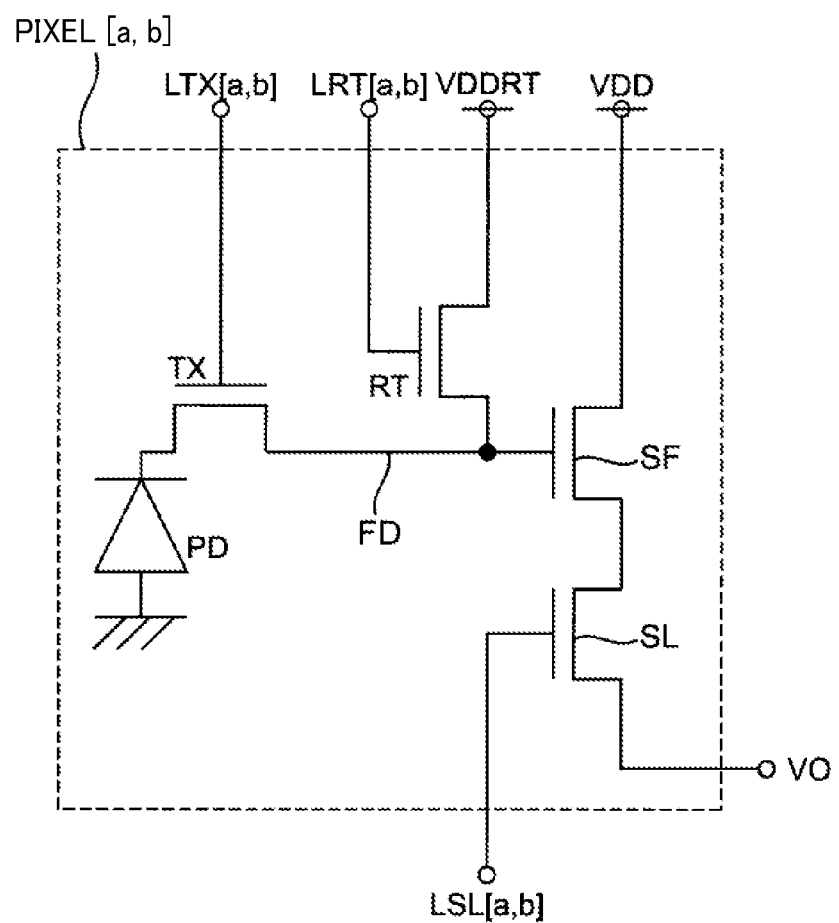
FIG. 2 is a circuit diagram illustrating a detailed configuration of a pixel in the solid-state image sensing device in FIG. 1.

FIG. 2 is a circuit diagram illustrating a detailed configuration of each of the pixels [a, b] in FIG. 1. The pixel [a, b] includes a photoelectric conversion element PD, a transfer transistor TX, a floating diffusion region FD, a reset transistor RT, an amplifier transistor SF, and a selection transistor SL.

The photoelectric conversion element PD converts the incident light on the pixel [a, b] into an electric charge. The photoelectric conversion element PD is a photodiode, for example.

The transfer transistor TX is connected between the photoelectric conversion element PD and the floating diffusion region FD. A gate terminal of the transfer transistor TX is applied with a control signal from the pixel control circuit 20 via the control line LTX [a, b]. In response to the control signal applied via the control line LTX [a, b], the transfer transistor TX transmits the electric charge from the photoelectric conversion element PD to the floating diffusion region FD.

The floating diffusion region FD is a region on the semiconductor substrate for temporarily storing the electric charge transferred from the photoelectric conversion element PD.

The reset transistor RT is connected between a reset power supply VDDRT and the floating diffusion region FD. A gate terminal of the reset transistor RT is applied with a control signal from the pixel control circuit 20 via the control line LRT [a, b]. In response to the control signal applied via the control line LRT [a, b], the reset transistor RT resets the potential of the floating diffusion region FD to the potential of the reset power supply VDDRT.

The amplifier transistor SF has a drain connected to a power supply VDD, a source connected to the selection transistor SL, and a gate connected to the floating diffusion region FD. The source of the amplifier transistor SF is connected to a constant current source outside the pixel array 10 via the selection transistor SL. The amplifier transistor SF forms a source follower together with the constant current source. The amplifier transistor SF amplifies the voltage of the floating diffusion region FD, to thereby generate a pixel signal with the amplified voltage.

The selection transistor SL has a drain connected to the source of the amplifier transistor SF, and has a source connected to a terminal VO. The terminal VO is connected to the signal line VOUT [a]. A gate of the selection transistor SL is applied with a control signal from the pixel control circuit 20 via the control line LSL [a, b]. The selection transistor SL selectively connects or disconnects the pixel [a, b] to or from the signal line VOUT [a]. When the selection transistor SL is turned on, the selection transistor SL connects the amplifier transistor SF to the signal line VOUT [a] to output the pixel signal generated by the amplifier transistor SF to the signal line VOUT [a].

Figure 3:
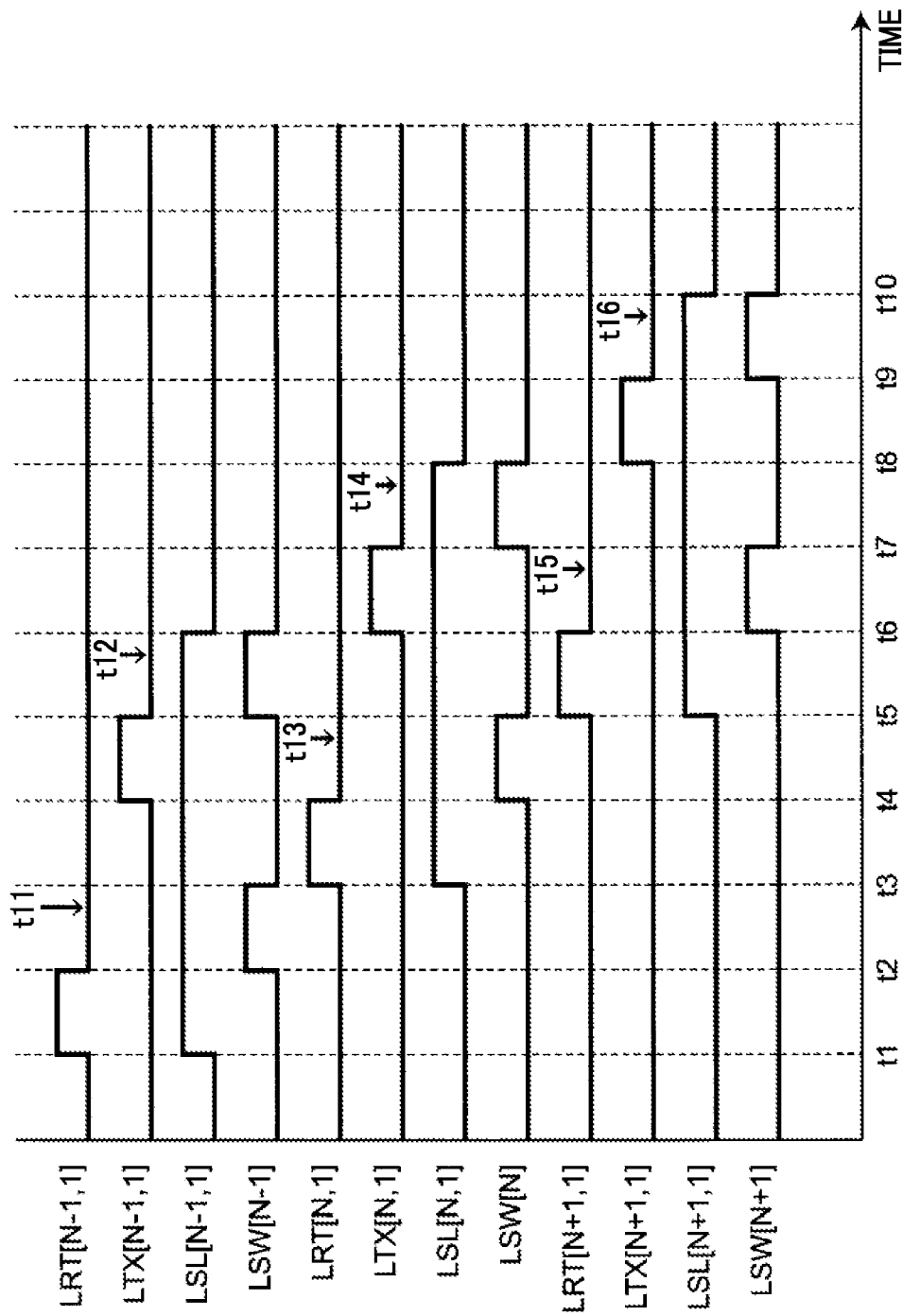
FIG. 3 is a timing chart illustrating operations of pixels in pixel sub-arrays of the solid-state image sensing device in FIG. 1.

FIG. 3 is a timing chart illustrating operations of the pixels [a, b] in the pixel sub-arrays [N−1], [N], and [N+1] in FIG. 1.

The control signals on the control lines LRT [a, b], LTX [a, b], and LSL [a, b] have a high-level potential (e.g., power supply potential) and a low-level potential (e.g., ground potential). Control lines LSW [a] are connected to the switches SW [a] of the read circuit 30. The read circuit 30 applies control signals to the switches SW [a] via the control lines LSW [a]. The control signals on the control lines LSW [a] also have the high-level potential and the low-level potential. The pixel signals on the signal lines VOUT [a] include a reset signal representing the potential to which the potential of the floating diffusion region FD is reset and an exposure signal representing the potential obtained when the electric charge is generated in accordance with the incident light.

Reading of the reset signal from each of the pixels [a, b] in the pixel sub-arrays [a] will first be described.

The pixel control circuit 20 transitions the potential of the control line LSL [a, b] from the low level to the high level, to thereby connect the signal line VOUT [a] to the amplifier transistor SF. It is thereby possible to read the reset signal from the pixel [a, b] to the signal line VOUT [a]. The pixel control circuit 20 further transitions the potential of the control line LRT [a, b] from the low level to the high level, to thereby reset the potential of the floating diffusion region FD of the pixel [a, b] to the potential of the reset power supply VDDRT. Thereafter, the pixel control circuit 20 transitions the potential of the control line LRT [a, b] from the high level to the low level, to thereby disconnect the floating diffusion region FD of the pixel [a, b] from the reset power supply VDDRT. Then, during the period in which the potential of the control line LSL [a, b] is at the high level, the read circuit 30 transitions the potential of the control line LSW [a] from the low level to the high level, to thereby connect the signal line VOUT [a] to the signal line HOUT. It is thereby possible to read the reset signal from the signal line VOUT [a] to the signal line HOUT. Thereafter, the read circuit 30 transitions the potential of the control line LSW [a] from the high level to the low level, to thereby disconnect the signal line VOUT [a] from the signal line HOUT. During the period in which the potential of the control line LSW [a] is at the high level, the read circuit 30 reads the reset signal from the pixel [a, b] via the signal line VOUT [a]. Thereby, a sampling operation is performed.

In the photoelectric conversion element PD of the pixel [a, b], an electric charge is generated in accordance with the incident light.

Reading of the exposure signal from each of the pixels [a, b] in the pixel sub-arrays [a] will now be described.

The pixel control circuit 20 transitions the potential of the control line LTX [a, b] from the low level to the high level, to thereby transfer the electric charge generated in the photoelectric conversion element PD in accordance with the incident light to the floating diffusion region FD. Thereafter, the pixel control circuit 20 transitions the potential of the control line LTX [a, b] from the high level to the low level, to thereby disconnect the floating diffusion region FD from the photoelectric conversion element PD. Then, during the period in which the potential of the control line LSL [a, b] is at the high level, the read circuit 30 transitions the potential of the control line LSW [a] from the low level to the high level, to thereby connect the signal line VOUT [a] to the signal line HOUT. It is thereby possible to read the exposure signal from the signal line VOUT [a] to the signal line HOUT. Thereafter, the read circuit 30 transitions the potential of the control line LSW [a] from the high level to the low level, to thereby disconnect the signal line VOUT [a] from the signal line HOUT. During the period in which the potential of the control line LSW [a] is at the high level, the read circuit 30 reads the exposure signal from the pixel [a, b] via the signal line VOUT [a]. Thereby, a sampling operation is performed. Finally, the pixel control circuit 20 transitions the potential of the control line LSL [a, b] from the high level to the low level, to thereby disconnect the signal line VOUT [a] from the amplifier transistor SF.

As described above, the pixel control circuit 20 generates the pixel signals in the pixels [a, b] of the pixel sub-arrays [a] such that the pixel sub-arrays [a] have the successive phase differences. Further, the read circuit 30 reads the pixel signals from the pixels [a, b] of the pixel sub-arrays [a] via the signal lines VOUT [a] such that the pixel sub-arrays [a] have the successive phase differences. The pixel signals are generated and read for each of the rows of the entire pixel array 10. Therefore, the generation and reading of pixel signals takes place in the pixels [a, 1] in the respective first rows of all of the pixel sub-arrays [a], and then in the pixels [a, 2] in the respective second rows of all of the pixel sub-arrays [a]. Thereafter, the generation and reading of pixel signals similarly takes place in the pixels [a, b] in the remaining rows.

Generation and reading of pixel signals in pixels [N−1, 1], [N, 1], and [N+1, 1] in the respective first rows of the pixel sub-arrays [N−1], [N], and [N+1] will be described below with reference to FIG. 3.

The pixel [N−1, 1] in the first row of the pixel sub-array [N−1] operates as follows. The potential of the control signal on a control line LSL [N−1, 1] is kept at the high level for the period from a time t1 to a time t6, to thereby connect a signal line VOUT [N−1] to the amplifier transistor SF of the pixel [N−1, 1]. Further, the potential of the control signal on a control line LRT [N−1, 1] is kept at the high level for the period from the time t1 to a time t2, to thereby reset the potential of the floating diffusion region FD of the pixel [N−1, 1]. Thereafter, the potential of the control signal on a control line LSW [N−1] is kept at the high level for the period from the time t2 to a time t3, to thereby connect the signal line VOUT [N−1] to the signal line HOUT. Herein, at a time after the time t2 and before the time t3 (e.g., a time t11 in the row of the control line LRT [N−1, 1] in FIG. 3), the reset signal of the pixel [N−1, 1] is read. Then, the potential of the control signal on a control line LTX [N−1, 1] is kept at the high level for the period from a time t4 to a time t5, to thereby transfer the electric charge from the photoelectric conversion element PD of the pixel [N−1, 1] to the floating diffusion region FD of the pixel [N−1, 1]. Thereafter, the potential of the control signal on the control line LSW [N−1] is kept at the high level for the period from the time t5 to the time t6, to thereby connect the signal line VOUT [N−1] to the signal line HOUT. Herein, at a time after the time t5 and before the time t6 (e.g., a time t12 in the row of the control line LTX [N−1, 1] in FIG. 3), the exposure signal of the pixel [N−1, 1] is read.

The pixel [N, 1] in the first row of the pixel sub-array [N] operates as follows. The potential of the control signal on the control line LSL [N, 1] is kept at the high level for the period from the time t3 to a time t8, to thereby connect a signal line VOUT [N] to the amplifier transistor SF of the pixel [N, 1]. Further, the potential of the control signal on the control line LRT [N, 1] is kept at the high level for the period from the time t3 to the time t4, to thereby reset the potential of the floating diffusion region FD of the pixel [N, 1]. Thereafter, the potential of the control signal on a control line LSW [N] is kept at the high level for the period from the time t4 to the time t5, to thereby connect the signal line VOUT [N] to the signal line HOUT. Herein, at a time after the time t4 and before the time t5 (e.g., a time t13 in the row of the control line LRT [N, 1] in FIG. 3), the reset signal of the pixel [N, 1] is read. Then, the potential of the control signal on a control line LTX [N, 1] is kept at the high level for the period from the time t6 to a time t7, to thereby transfer the electric charge from the photoelectric conversion element PD of the pixel [N, 1] to the floating diffusion region FD of the pixel [N, 1]. Thereafter, the potential of the control signal on the control line LSW [N] is kept at the high level for the period from the time t7 to the time t8, to thereby connect the signal line VOUT [N] to the signal line HOUT. Herein, at a time after the time t7 and before the time t8 (e.g., a time t14 in the row of the control line LTX [N, 1] in FIG. 3), the exposure signal of the pixel [N, 1] is read.

The pixel [N+1, 1] in the first row of the pixel sub-array [N+1] operates as follows. The potential of the control signal on a control line LSL [N+1, 1] is kept at the high level for the period from the time t5 to a time t10, to thereby connect a signal line VOUT [N+1] to the amplifier transistor SF of the pixel [N+1, 1]. Further, the potential of the control signal on a control line LRT [N+1, 1] is kept at the high level for the period from the time t5 to the time t6, to thereby reset the potential of the floating diffusion region FD of the pixel [N+1, 1]. Thereafter, the potential of the control signal on a control line LSW [N+1] is kept at the high level for the period from the time t6 to the time t7, to thereby connect the signal line VOUT [N+1] to the signal line HOUT. Herein, at a time after the time t6 and before the time t7 (e.g., a time t15 in the row of the control line LRT [N+1, 1] in FIG. 3), the reset signal of the pixel [N+1, 1] is read. Then, the potential of the control signal on a control line LTX [N+1, 1] is kept at the high level for the period from the time t8 to a time t9, to thereby transfer the electric charge from the photoelectric conversion element PD of the pixel [N+1, 1] to the floating diffusion region FD of the pixel [N+1, 1]. Thereafter, the potential of the control signal on the control line LSW [N+1] is kept at the high level for the period from the time t9 to the time t10, to thereby connect the signal line VOUT [N+1] to the signal line HOUT. Herein, at a time after the time t9 and before the time t10 (e.g., a time t16 in the row of the control line LTX [N+1, 1] in FIG. 3), the exposure signal of the pixel [N+1, 1] is read.

After the pixel signals of all of the pixels [a, 1] in the first row of the pixel array 10 are generated and read, the pixel signals of the pixels [a, 2] in the respective second rows of the pixel sub-arrays [a] are generated and read. Then, a similar process is performed on the remaining rows to the last one.

The read circuit 30 preferably reads the pixel signal from each of the pixels [a, b] of the pixel sub-arrays [a] via the signal lines VOUT [a] at a time other than the rise time and the fall time of the control signal on each of the control lines LRT [a, b], LTX [a, b], and LSL [a, b]. If the time of reading the pixel signal is the same as the rise time or the fall time of the control signal, the potential of the power supply and the potential of the substrate may be changed by changes in voltage on the control lines LRT [a, b], LTX [a, b], and LSL [a, b] in mutually adjacent pixel sub-arrays [a]. This may change signals of the pixel sub-array [a] from which the pixel signal is to be read, thereby deteriorating the image quality. The operation illustrated in FIG. 3 suppresses such changes in potentials and deterioration of the image quality.

According to the solid-state image sensing device 100 in FIG. 1, the pixel signals are generated and read such that the pixel sub-arrays [a] have the successive phase differences. It is therefore possible for the pixel sub-arrays [a] to share a circuit subsequent to the read circuit 30. As compared with a configuration in which a circuit is provided for each of the columns of the pixel array 10, therefore, the solid-state image sensing device 100 substantially reduces the number of circuit components, thereby reducing the chip size.

As described above, according to the solid-state image sensing device 100 in FIG. 1, the read circuit 30 that reads the pixel signals is reduced in circuit size.

Figure 4:
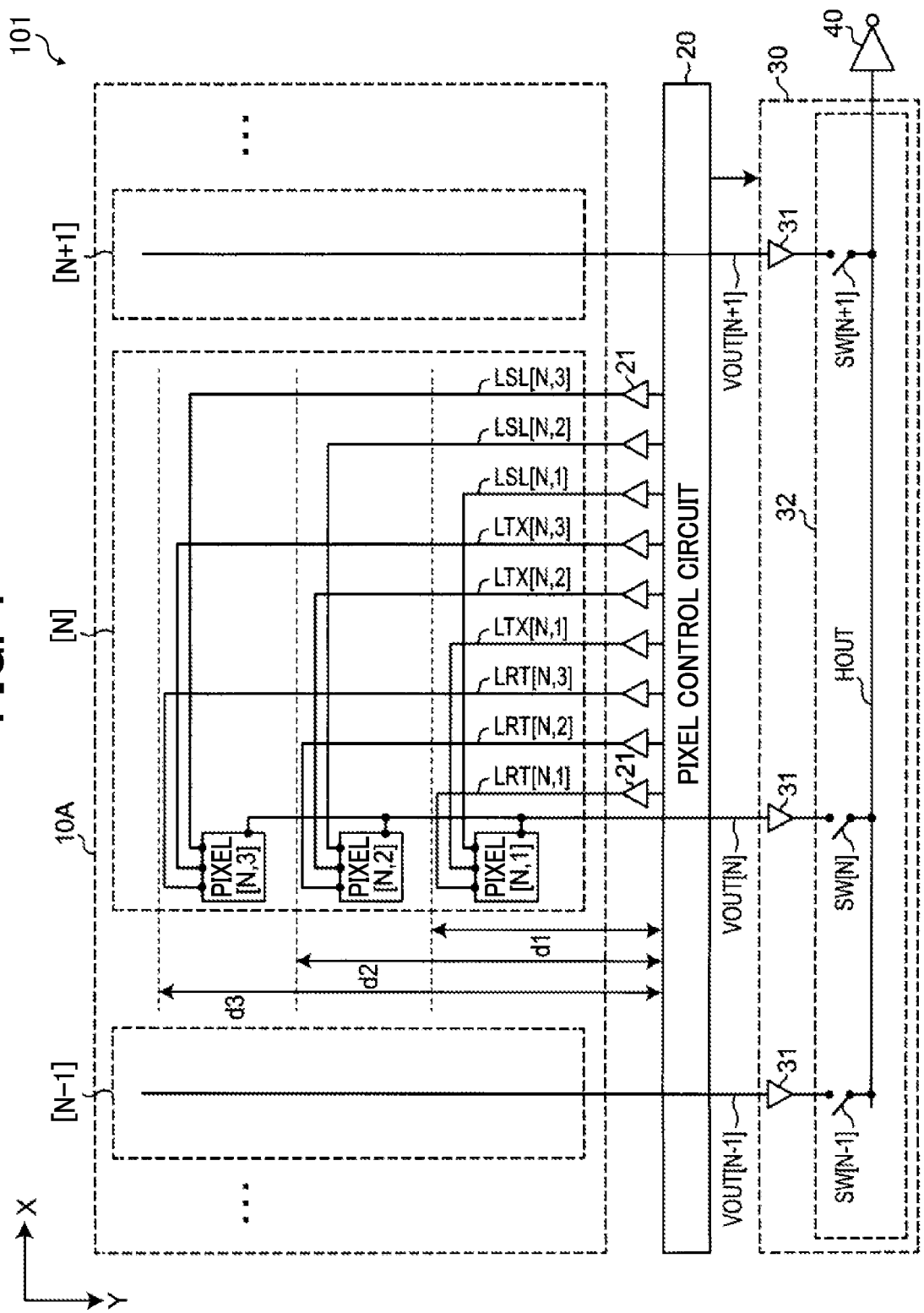
FIG. 4 is a block diagram illustrating a general arrangement of a solid-state image sensing device according to a modified example of the first embodiment.

FIG. 4 is a block diagram illustrating a general arrangement of a solid-state image sensing device 101 according to a modified example of the first embodiment. The solid-state image sensing device 101 in FIG. 4 includes a pixel array 10A in place of the pixel array 10 in FIG. 1.

In each of the pixel sub-arrays [a] of the pixel array 10A, the control lines LRT [a, b], LTX [a, b], and LSL [a, b] are different in length from those in FIG. 1.

In the example of FIG. 4, a segment of the control line LRT [N, 1] arranged along the sub-scanning direction has a length equal to a distance d1 from the pixel [N, 1] connected to the control line LRT [N, 1] to the pixel control circuit 20, and does not include a segment extending from the pixel [N, 1] in a direction away from the pixel control circuit 20. Further, a segment of the control line LRT [N, 2] arranged along the sub-scanning direction has a length equal to a distance d2 from the pixel [N, 2] connected to the control line LRT [N, 2] to the pixel control circuit 20, and does not include a segment extending from the pixel [N, 2] in the direction away from the pixel control circuit 20. Further, a segment of the control line LRT [N, 3] arranged along the sub-scanning direction has a length equal to a distance d3 from the pixel [N, 3] connected to the control line LRT [N, 3] to the pixel control circuit 20, and does not include a segment extending from the pixel [N, 3] in the direction away from the pixel control circuit 20. The other control lines LTX [N, b] and LSL [N, b] are also formed similarly to the control lines LRT [N, b].

According to the solid-state image sensing device 101 in FIG. 4, the farther from the pixel control circuit 20 the location is, the smaller the number of the control lines LRT [a, b], LTX [a, b], and LSL [a, b] is. As compared with the configuration in FIG. 1, therefore, the configuration in FIG. 4 further reduces the vignetting of light due to the control lines LRT [a, b], LTX [a, b], and LSL [a, b], thereby further improving the sensitivity.

A second embodiment of the present invention will now be described.

Figure 5:
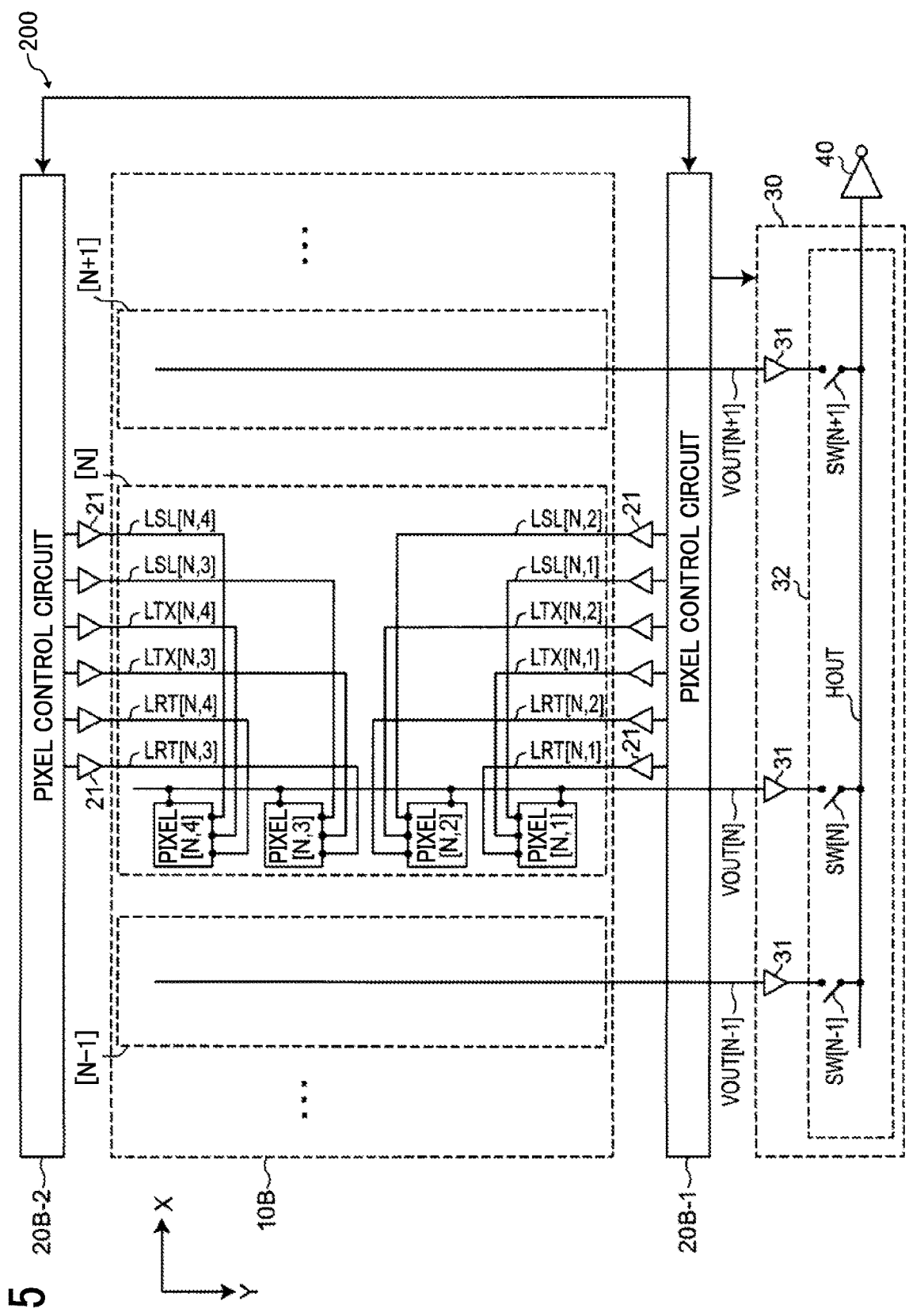
FIG. 5 is a block diagram illustrating a general arrangement of a solid-state image sensing device according to a second embodiment of the present invention.

FIG. 5 is a block diagram illustrating a general arrangement of a solid-state image sensing device 200 according to the second embodiment of the present invention. The solid-state image sensing device 200 in FIG. 5 includes a pixel array 10B and pixel control circuits 20B-1 and 20B-2 in place of the pixel array 10 and the pixel control circuit 20 in FIG. 1.

Each of the pixel sub-arrays [a] of the pixel array 10B includes a plurality of pixels [a, b] arranged to form a plurality of rows (i.e., four rows in FIG. 5) along the main scanning direction and at least one column (i.e., one column in FIG. 5) along the sub-scanning direction. Herein, "a" represents the number of each pixel sub-array (i.e., N−1, N, or N+1 in FIG. 5), and "b" represents the number of each row (i.e., 1, 2, 3, or 4 in FIG. 5).

The pixel control circuits 20B-1 and 20B-2 are arranged facing each other across the pixel array 10B. In the present specification, the pixel control circuits 20B-1 and 20B-2 will also be described as the first pixel control circuit part and the second pixel control circuit part. In each of the pixel sub-arrays [a] of the pixel array 10B, each of the pixels [a, b] connected to the signal line VOUT [a] is connected to one of the pixel control circuits 20B-1 and 20B-2 via the control lines LRT [a, b], LTX [a, b], and LSL [a, b]. In the example of FIG. 5, the pixels [N, 1] and [N, 2] are connected to the pixel control circuit 20B-1, and the pixels [N, 3] and [N, 4] are connected to the pixel control circuit 20B-2.

In the solid-state image sensing device 200 in FIG. 5, the single pixel control circuit 20 as illustrated in FIG. 1 is replaced by the two pixel control circuits 20B-1 and 20B-2 arranged facing each other across the pixel array 10B. As compared with the configuration in FIG. 1, therefore, the configuration in FIG. 5 reduces the area (particularly the length in the main scanning direction) for arranging the control lines LRT [a, b], LTX [a, b], and LSL [a, b] in each of the pixel sub-arrays [a], and thus further reduces the vignetting of light due to the control lines LRT [a, b], LTX [a, b], and LSL [a, b], thereby further improving the sensitivity.

A third embodiment of the present invention will now be described.

In the third embodiment, each of the pixel sub-arrays [a] may include a plurality of pixels arranged to form a plurality of columns along the sub-scanning direction instead of a single column along the sub-scanning direction.

Figure 6:
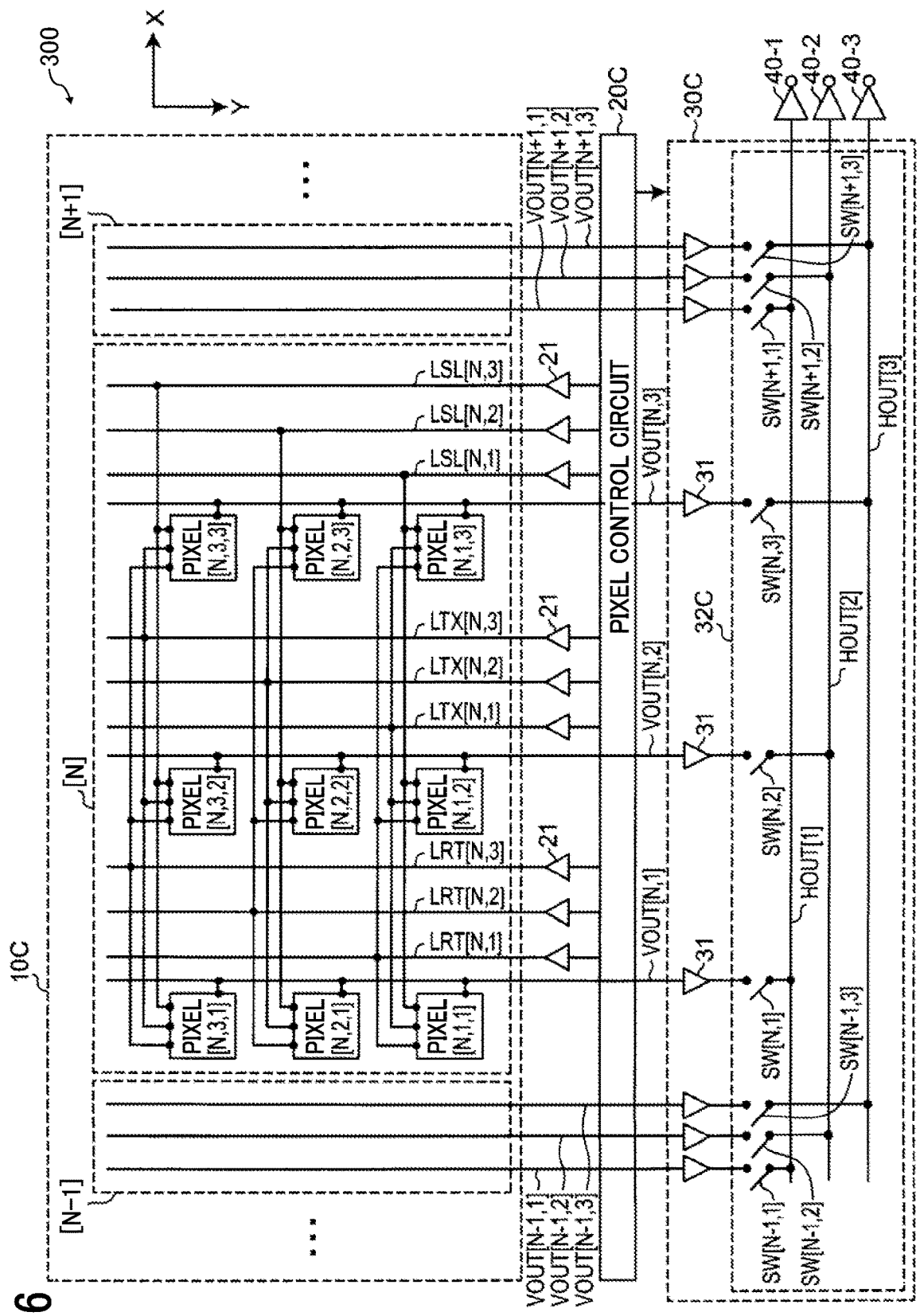
FIG. 6 is a block diagram illustrating a general arrangement of a solid-state image sensing device according to a third embodiment of the present invention.

FIG. 6 is a block diagram illustrating a general arrangement of a solid-state image sensing device 300 according to the third embodiment of the present invention. The solid-state image sensing device 300 in FIG. 6 includes a pixel array 10C, a pixel control circuit 20C, a read circuit 30C, amplifiers 40-1, 40-2, and 40-3, the plurality of control lines LRT [a, b], LTX [a, b], and LSL [a, b], and a plurality of signal lines VOUT [a, c].

Each of the pixel sub-arrays [a] of the pixel array 10C includes a plurality of pixels [a, b, c] arranged two-dimensionally to form a plurality of rows (i.e., three rows in FIG. 6) along the main scanning direction and a plurality of columns (i.e., three columns in FIG. 6) along the sub-scanning direction. Herein, "a" represents the number of each pixel sub-array (i.e., N−1, N, or N+1 in FIG. 6), "b" represents the number of each row (i.e., 1, 2, or 3 in FIG. 6), and "c" represents the number of each column (i.e., 1, 2, or 3 in FIG. 6) in each of the pixel sub-arrays [a]. Each of the pixels [a, b, c] in FIG. 6 is configured similarly to the pixel [a, b] in FIG. 2.

In each of the pixel sub-arrays [a] of the pixel array 10C, each of the control lines LRT [a, b], LTX [a, b], and LSL [a, b] is connected to all pixels [a, b, c] in one of the rows of the pixel sub-array [a]. Therefore, the control line LRT [N, 1] is connected to three pixels [N, 1, 1], [N, 1, 2], and [N, 1, 3] in the first row. Similarly, the control line LRT [N, 2] is connected to three pixels [N, 2, 1], [N, 2, 2], and [N, 2, 3] in the second row, and the control line LRT [N, 3] is connected to three pixels [N, 3, 1], [N, 3, 2], and [N, 3, 3]

in the third row. The other control lines LTX [N, b] and LSL [N, b] are also connected to the pixels [a, b, c] similarly to the control lines LRT [N, b].

The plurality of signal lines VOUT [a, c] are connected to the pixels [a, b, c] in each of the pixel sub-arrays [a]. Herein, each of the columns in the pixel sub-array [a] is equipped with one signal line VOUT [a, c] to connect all pixels [a, b, c] in each of the columns to one signal line VOUT [a, c]. In the example of FIG. 6, the pixels [N, 1, 1], [N, 2, 1], and [N, 3, 1] are connected to a signal line VOUT [N, 1]. Similarly, the pixels [N, 1, 2], [N, 2, 2], and [N, 3, 2] are connected to a signal line VOUT [N, 2], and the pixels [N, 1, 3], [N, 2, 3], and [N, 3, 3] are connected to a signal line VOUT [N, 3].

The pixel control circuit 20C applies the control signals to the pixels [a, b, c] of the pixel sub-arrays [a] via the control lines LRT [a, b], LTX [a, b], and LSL [a, b]. Thereby, the pixel control circuit 20C generates the pixel signals in the pixels [a, b, c] of the pixel sub-arrays [a] such that the pixel sub-arrays [a] have the successive phase differences. In this case, all pixels [a, b, c] in each of the rows in each of the pixel sub-arrays [a] are connected to the same control line LRT [a, b], the same control line LTX [a, b], and the same control line LSL [a, b], and thus simultaneously operate to simultaneously generate the pixel signals. Further, the pixel control circuit 20C generates the pixel signals for each of the rows of the entire pixel array 10C. The control lines LRT [a, b], LTX [a, b], and LSL [a, b] are equipped with the amplifiers 21 between the pixel control circuit 20C and the pixel sub-arrays [a].

The read circuit 30C includes the plurality of amplifiers 31 and a transfer circuit 32C. The plurality of amplifiers 31 are located on the signal lines VOUT [a, c] between the pixel sub-arrays [a] and the transfer circuit 32C, and amplify, in an analog manner, the pixel signals read from the pixels [a, b, c]. The transfer circuit 32C includes a plurality of switches SW [a, c], which are the same in number as the signal lines VOUT [a, c], and a plurality of signal lines HOUT [c] (i.e., three signal lines HOUT [c] in the example of FIG. 6), which are the same in number as the columns in each of the pixel sub-arrays [a]. Each of the switches SW [a, c] selectively transmits the pixel signals amplified by the corresponding amplifier 31 to the corresponding signal line HOUT [c]. The signal line HOUT [c] transmits the pixel signals read from the pixels [a, b, c] to the corresponding one of the amplifiers 40-1, 40-2, and 40-3 in an analog manner as serial signals. Thereby, the read circuit 30C reads the pixel signals from the pixels [a, b, c] of the pixel sub-arrays [a] via the signal lines VOUT [a, c] such that the pixel sub-arrays [a] have the successive phase differences. In this process, the pixel signals simultaneously read from all pixels [a, b, c] in each of the rows in each of the pixel sub-arrays [a] are individually transferred via the corresponding signal line HOUT [c]. Further, for each of the rows of the entire pixel array 10C, the read circuit 30C reads the pixel signals generated for each of the rows of the entire pixel array 10C by the pixel control circuit 20C.

The amplifiers 40-1, 40-2, and 40-3 amplify the signals output from the read circuit 30C similarly to the amplifier 40 in FIG. 1.

In the past, to reduce the circuit size of the integrated circuit including the CMOS line sensor, a rolling readout method has been proposed in which the pixel signals of a plurality of pixels arranged in the main scanning direction or the sub-scanning direction are sequentially read via the same signal line. The existing rolling readout method reads the pixel signals in the row direction on a pixel-by-pixel basis, and thus may cause unevenness in the form of vertical stripes due to the time difference in reading. According to the solid-state image sensing device 300 of the third embodiment, on the other hand, the pixel signals of the plurality of pixels [a, b, c] in one row are simultaneously generated and simultaneously read for each of the pixel sub-arrays [a]. Consequently, the time difference in generating or reading the pixel signals is reduced, thereby suppressing the unevenness.

Figure 7:
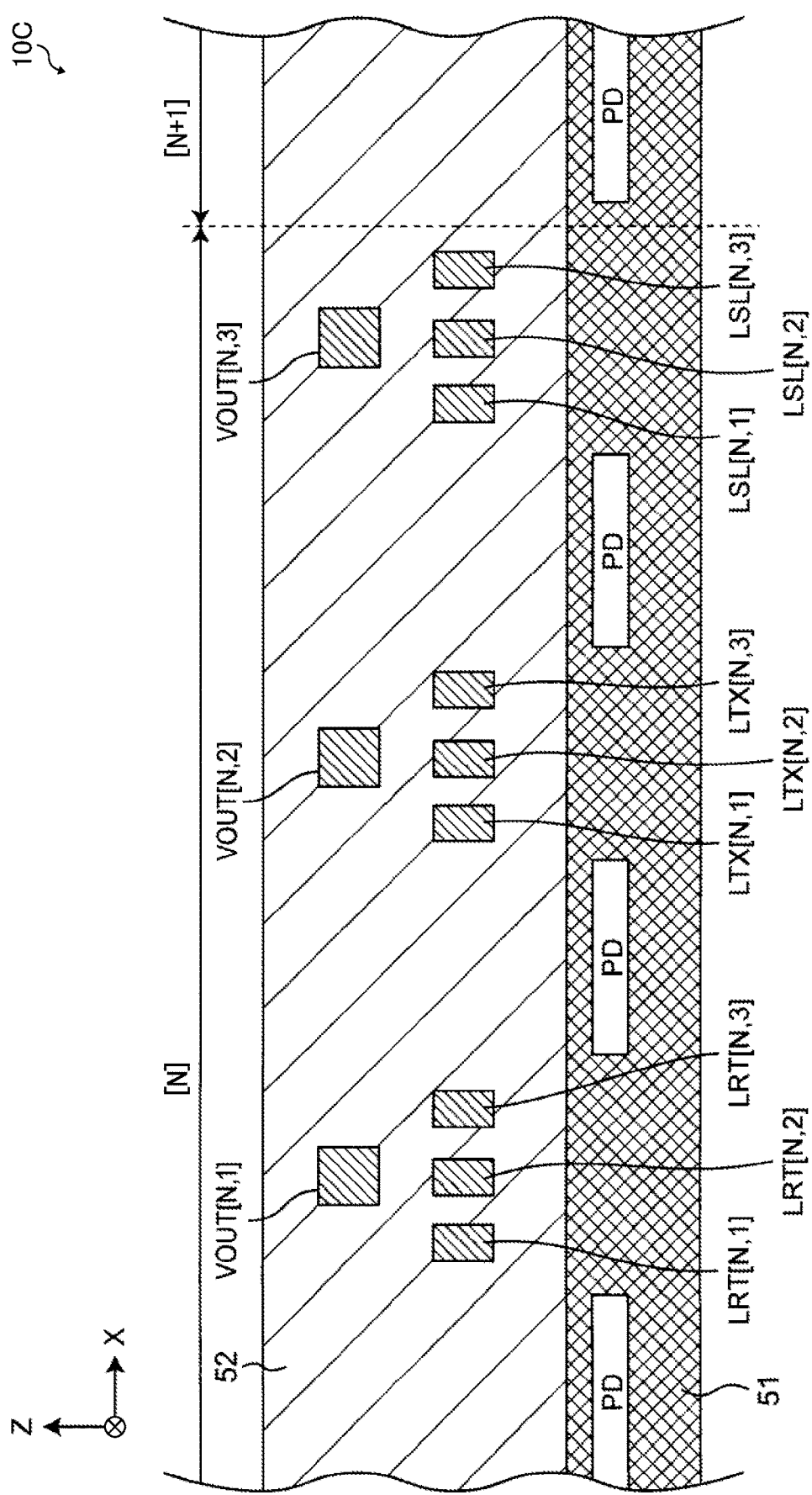
FIG. 7 is a sectional view of a part of a pixel array of the solid-state image sensing device in FIG. 6.

FIG. 7 is a sectional view of a part of the pixel array 10C in FIG. 6. The pixel array 10C includes a semiconductor substrate 51 and an interlayer film 52 formed thereon. Lines such as the control lines LRT [a, b], LTX [a, b], and LSL [a, b] and the signal lines VOUT [a, c] are formed in the interlayer film 52. As illustrated in FIG. 7, the signal lines VOUT [a, c] may be formed in one conductive layer, and the control lines LRT [a, b], LTX [a, b], and LSL [a, b] may be formed in another conductive layer.

In FIG. 7, wiring openings of the pixels [a, b, c] have a repeated pattern, making the opening size uniform. Herein, an "opening" refers to a tubular area not including wiring, as viewed from above the semiconductor substrate 51 of the pixel array 10C. In FIG. 7, there are areas with no wiring between the signal lines VOUT [N, 1] and VOUT [N, 2] and between the signal lines VOUT [N, 2] and VOUT [N, 3] in the X direction of the semiconductor substrate 51 of the pixel array 10C. Similarly, there are areas with no wiring in the Y direction of the semiconductor substrate 51 of the pixel array 10C. As viewed from above the semiconductor substrate 51 of the pixel array 10C, therefore, tubular areas with no wiring exist as openings through which light is incident.

According to the solid-state image sensing device 300 in FIGS. 6 and 7, all pixels [a, b, c] in each of the rows are connected to the same control line LRT [a, b], the same control line LTX [a, b], and the same control line LSL [a, b]. Therefore, as compared with a configuration in which the pixels [a, b, c] in each of the rows are connected to different control lines LRT [a, b], different control lines LTX [a, b], and different control lines LSL [a, b], the configuration in FIGS. 6 and 7 reduces the number of the control lines LRT [a, b], LTX [a, b], and LSL [a, b], and thus further reduces the vignetting of light due to the control lines LRT [a, b], LTX [a, b], and LSL [a, b], thereby further improving the sensitivity.

A fourth embodiment of the present invention will now be described.

Figure 8:
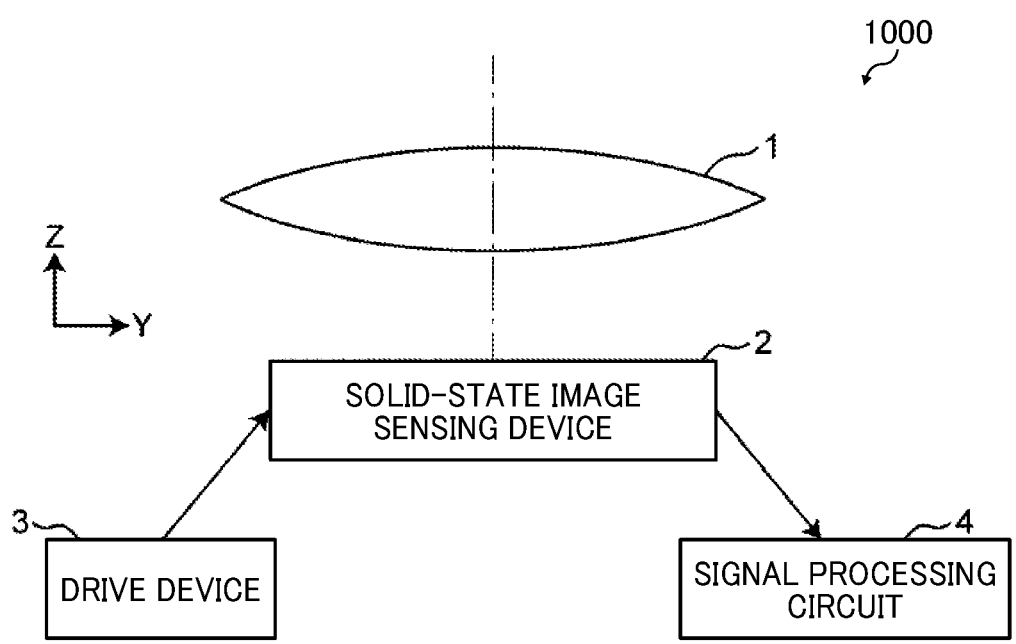
FIG. 8 is a block diagram illustrating a configuration of an imaging apparatus according to a fourth embodiment of the present invention.

FIG. 8 is a block diagram illustrating a configuration of an imaging apparatus 1000 according to the fourth embodiment of the present invention. The imaging apparatus 1000 in FIG. 8 includes a lens 1, a solid-state image sensing device 2, a drive device 3, and a signal processing circuit 4. The imaging apparatus 1000 in FIG. 8 is a camera, for example.

The solid-state image sensing device 2 is one of the solid-state image sensing devices 100, 101, 200, and 300 of the first to third embodiments. The lens 1 is an optical system that guides the incident light to the pixels of the solid-state image sensing device 2.

The drive device 3 moves the solid-state image sensing device 2 relative to a subject at a predetermined speed in the sub-scanning direction. The drive device 3 includes a timing generator that generates timing signals for driving circuits of the imaging apparatus 1000. With this configuration, the drive device 3 drives the imaging apparatus 1000.

The signal processing circuit 4 processes output signals from the solid-state image sensing device 2. Output signals from the signal processing circuit 4 may be recorded on a recording medium such as a memory. Image information recorded on the recording medium may be output as a hardcopy by a printer, for example. Further, the output signals from the signal processing circuit 4 may be displayed on a monitor such as a liquid crystal display as a still or video image.

If the output signals from the signal processing circuit 4 are analog signals, an analog-to-digital converter circuit, such as an analog front end (AFE), may be provided as a circuit subsequent to the signal processing circuit 4. If the output signals from the signal processing circuit 4 are digital signals, a digital signal processing circuit, such as a digital front end (DFE), may be provided as a circuit subsequent to the signal processing circuit 4.

With one of the solid-state image sensing devices 100, 101, 200, and 300 of the first to third embodiments, an imaging apparatus (e.g., camera) with improved accuracy is realized.

The solid-state image sensing devices 100, 101, 200, and 300 of the first to third embodiments are also applicable to a line sensor for a printer multifunction peripheral, for example, as well as to the camera.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention. Further, the above-described steps are not limited to the order disclosed herein.

The invention claimed is:

1. A solid-state image sensing device comprising:
a pixel array including a plurality of pixels arranged two-dimensionally in a main scanning direction and a sub-scanning direction to generate a pixel signal in each of the plurality of pixels in accordance with incident light,
the pixel array including
a plurality of pixel sub-arrays arranged in the main scanning direction, each of the plurality of pixel sub-arrays including a plurality of pixels arranged to form a plurality of rows along the main scanning direction and at least one column along the sub-scanning direction;
a plurality of control lines connected to the plurality of pixels in the plurality of pixel sub-arrays, each of the plurality of control lines being connected to at least one of the plurality of pixels in one of the plurality of pixel sub-arrays, and a plurality of pixels in each of the at least one column in each of the plurality of pixel sub-arrays being connected to different ones of the plurality of control lines;
a plurality of signal lines connected to the plurality of pixels in the plurality of pixel sub-arrays, each of the plurality of signal lines being connected to all pixels in each of the at least one column in one of the plurality of pixel sub-arrays;
a pixel control circuit configured to apply a control signal to each of the plurality of pixels in the plurality of pixel sub-arrays via the plurality of control lines to generate the pixel signal in each of the plurality of pixels in the plurality of pixel sub-arrays to cause successive phase differences between the plurality of pixel sub-arrays; and
a read circuit configured to read the pixel signal from each of the plurality of pixels in the plurality of pixel sub-arrays via the plurality of signal lines to cause successive phase differences between the plurality of pixel sub-arrays.

2. The solid-state image sensing device of claim 1, wherein the pixel array, the pixel control circuit, and the read circuit are arranged in the sub-scanning direction,
wherein each of the plurality of control lines and the plurality of signal lines includes a segment arranged along the sub-scanning direction, and
wherein the respective segments of the plurality of control lines arranged along the sub-scanning direction have a same length.

3. The solid-state image sensing device of claim 1, wherein the pixel array, the pixel control circuit, and the read circuit are arranged in the sub-scanning direction,
wherein each of the plurality of control lines and the plurality of signal lines includes a segment arranged along the sub-scanning direction, and
wherein the segment of the each of the plurality of control lines arranged along the sub-scanning direction has a length equal to a distance from a pixel connected to the each of the plurality of control lines to the pixel control circuit, and extends from the pixel connected to the each of the plurality of control lines to the pixel control circuit.

4. The solid-state image sensing device of claim 1, wherein at a time other than a rise time and a fall time of the control signal on each of the plurality of control lines, the read circuit reads the pixel signal from each of the plurality of pixels in the plurality of pixel sub-arrays via the plurality of signal lines.

5. The solid-state image sensing device of claim 1, wherein the pixel control circuit includes a first pixel control circuit part and a second pixel control circuit part arranged facing each other across the pixel array, and
wherein each of the plurality of pixels connected to the plurality of signal lines is connected to one of the first pixel control circuit part and the second pixel control circuit part.

6. The solid-state image sensing device of claim 1, wherein each of the plurality of pixel sub-arrays includes a plurality of pixels arranged to form a plurality of rows along the main scanning direction and a plurality of columns along the sub-scanning direction, and
wherein, in each of the plurality of pixel sub-arrays, each of the plurality of control lines is connected to all pixels in one of the plurality of rows in the each of the plurality of pixel sub-arrays.

7. The solid-state image sensing device of claim 1, wherein each of the plurality of pixels includes
a photoelectric conversion element configured to convert the incident light into an electric charge,
a floating diffusion region,
a transfer transistor configured to transfer the electric charge from the photoelectric conversion element to the floating diffusion region,
a reset transistor configured to reset a potential of the floating diffusion region,
an amplifier transistor configured to amplify a voltage of the floating diffusion region to generate the pixel signal, and
a selection transistor configured to selectively connect the each of the plurality of pixels to one of the plurality of signal lines, and
wherein the plurality of control lines include
a first control line connected to the transfer transistor of the each of the plurality of pixels,
a second control line connected to the reset transistor of the each of the plurality of pixels, and a third control line connected to the selection transistor of the each of the plurality of pixels.

8. An imaging apparatus comprising:

the solid-state image sensing device of claim 1;

an optical system configured to guide the incident light to each of the plurality of pixels in the solid-state image sensing device;

a signal processing circuit configured to process an output signal from the solid-state image sensing device; and a drive device configured to drive the solid-state image sensing device.

* * * * *